United States Patent
Nam

(10) Patent No.: US 7,262,120 B2
(45) Date of Patent: Aug. 28, 2007

(54) METHOD FOR FABRICATING METAL LINE IN SEMICONDUCTOR DEVICE

(75) Inventor: Ki-Won Nam, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 117 days.

(21) Appl. No.: 11/298,758

(22) Filed: Dec. 9, 2005

(65) Prior Publication Data

US 2006/0281286 A1    Dec. 14, 2006

(30) Foreign Application Priority Data

Jun. 10, 2005    (KR) ............... 10-2005-0049805

(51) Int. Cl.
  *H01L 21/20* (2006.01)
(52) U.S. Cl. ............ 438/584; 438/634; 438/637; 438/638; 257/E21.641
(58) Field of Classification Search ........ 438/584, 438/634, 637, 638
See application file for complete search history.

(56) References Cited

U.S. PATENT DOCUMENTS

| 5,888,902 | A | * | 3/1999 | Jun .................... 438/637 |
| 6,297,145 | B1 | * | 10/2001 | Ito .................... 438/619 |
| 6,498,092 | B2 | * | 12/2002 | Lee et al. ............ 438/634 |
| 2003/0060053 | A1 | * | 3/2003 | Ichihashi et al. ..... 438/694 |
| 2004/0009656 | A1 | * | 1/2004 | Lee et al. ............ 438/624 |

* cited by examiner

*Primary Examiner*—Asok K. Sarkar
*Assistant Examiner*—Victor V. Yevsikov
(74) *Attorney, Agent, or Firm*—Blakely Sokoloff Taylor & Zafman

(57) ABSTRACT

A method for fabricating a metal line in a semiconductor device is provided. The method includes: forming an inter-layer insulation layer on a substrate; forming a contact hole by etching the inter-layer insulation layer; forming a metal layer on the inter-layer insulation layer and the contact hole; etching a portion of the metal layer through performing a first etching process; and etching a remaining portion of the metal layer through performing a second etching process until the surface of the inter-layer insulation layer is exposed and a bottom portion of the metal line is sloped.

11 Claims, 3 Drawing Sheets

METHOD FOR FABRICATING METAL LINE IN SEMICONDUCTOR DEVICE

FIELD OF THE INVENTION

The present invention relates to a method for fabricating a semiconductor device; and, more particularly, to a method for fabricating a metal line in a semiconductor device.

DESCRIPTION OF RELATED ARTS

As semiconductor devices have been highly integrated, the design rule has continuously decreased. Thus, it is required to select an effective contact burial method capable of securing semiconductor device reliability, and adequate for a mass production. Herein, the method includes burying contact openings (e.g., contact holes and via holes) in the size of a sub-half micron with a high difference in height with reproducibility. The method for burying contact openings has important effects on a multilayered lining process including an inter-layer insulation layer and a follow-up process.

Recently, a tungsten (W) plug process has been suggested for the contact opening burying method, for the tungsten plug process has extremely low resistivity, and is advantageous with respect to contact resistance.

FIG. 1 is a cross-sectional view briefly illustrating a conventional method for fabricating a metal line in a semiconductor device.

Referring to FIG. 1, an inter-layer insulation layer 12 is formed on a substrate 11, wherein the substrate 11 is completed with prescribed processes. Then, a contact hole is formed by selectively etching the inter-layer insulation layer 12. Next, a contact plug 13 buried in the contact hole is formed. Herein, the contact plug 13 is a tungsten plug with tungsten buried in the contact hole.

Subsequently, an aluminum layer for use as a metal line is formed on the inter-layer insulation layer 12 and the contact plug 13. Then, the aluminum layer is selectively patterned to form a metal line 14.

However, according to the conventional method, if a misalignment between the metal line 14 and the contact plug 13 occurs, a shortage in an overlay margin often results. Thus, an undercut is generally generated, forming a void 15, and a crack may also be generated due to damage on the contact plug 13 during the etching process for the metal line 14, resulting in a reliability fail of a package.

Also, the conventional method requires an excessive etching to prevent a generation of micro-bridges during the etching process for forming the metal line 14. Because a vertical profile is formed due to the excessive etching, damage may occur to the contact plug 13 when the misalignment is generated.

SUMMARY OF THE INVENTION

It is, therefore, an object of the present invention to provide a method for fabricating a metal line in a semiconductor device capable of preventing contact plug damage when a misalignment occurs between the metal line and the contact plug.

In accordance with an aspect of the present invention, there is provided a method for fabricating a metal line in a semiconductor device, including: forming an inter-layer insulation layer on a substrate; forming a contact hole by etching the inter-layer insulation layer; forming a metal layer on the inter-layer insulation layer and the contact hole; etching a portion of the metal layer through performing a first etching process; and etching a remaining portion of the metal layer through performing a second etching process until the surface of the inter-layer insulation layer is exposed and a bottom portion of the metal line is sloped.

In accordance with another aspect of the present invention, there is provided a method for fabricating a metal line in a semiconductor device, including: forming an inter-layer insulation layer on a substrate; forming a contact hole by etching the inter-layer insulation layer; forming a tungsten plug buried in the contact hole; forming an aluminum layer on the inter-layer insulation layer and the tungsten plug by employing a low temperature process; etching a portion of the aluminum layer through performing a first etching process; and etching a remaining portion of the aluminum layer through performing a second etching process until the surface of the inter-layer insulation layer is exposed and a bottom portion of the aluminum layer is sloped.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

A method for fabricating a metal line in a semiconductor device in accordance with specific embodiments of the present invention will be described in detail with reference to the accompanying drawings.

Figure 1:
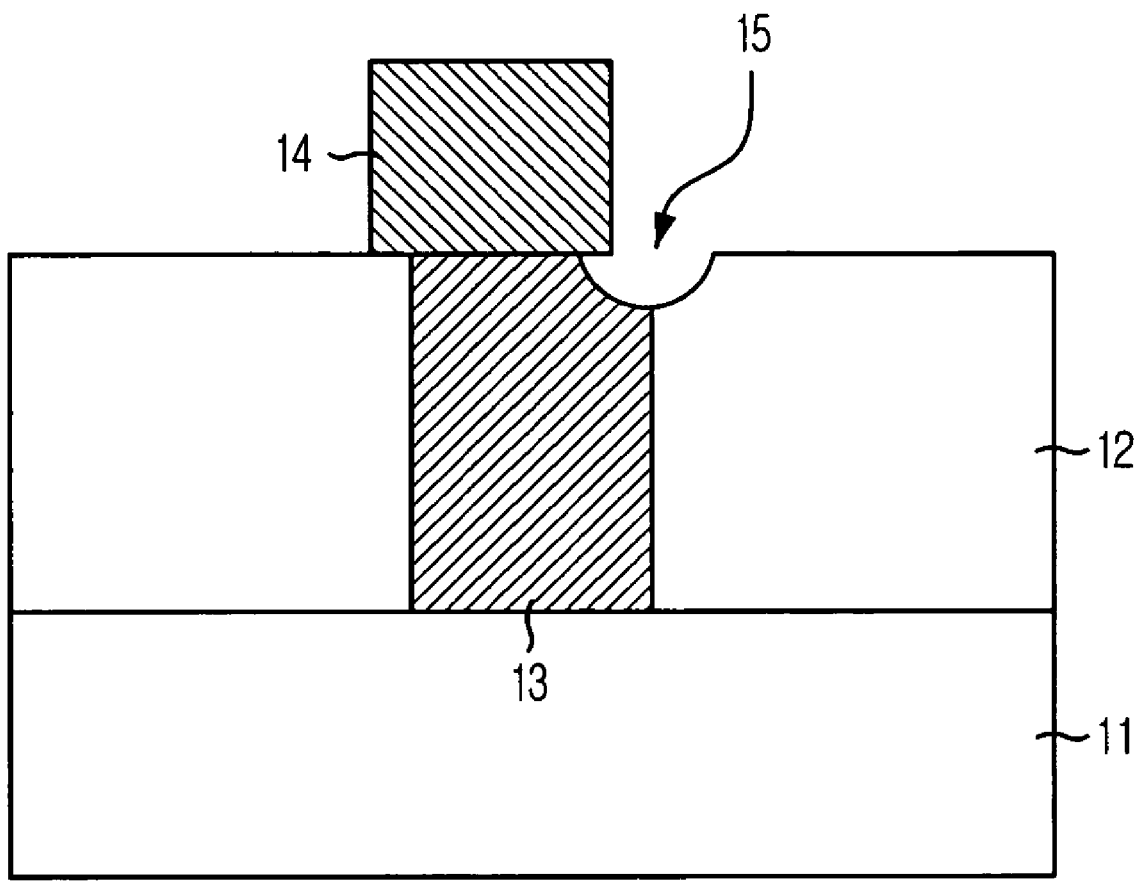
FIG. 1 is a cross-sectional view illustrating a conventional method for fabricating a metal line in a semiconductor device.
Figure 2A:
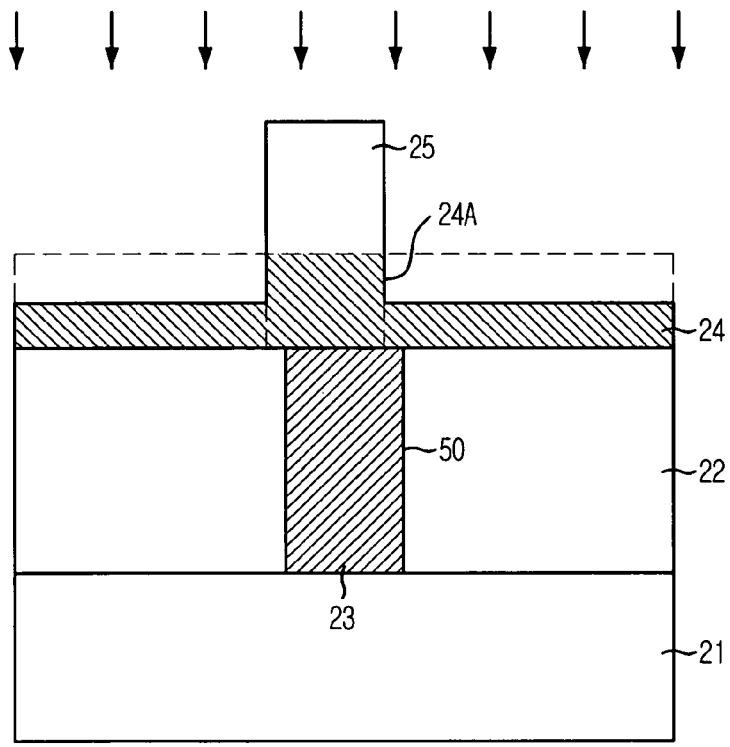
FIGS. 2A to 2C are cross-sectional views illustrating a method for fabricating a metal line in a semiconductor device in accordance with a specific embodiment of the present invention.
Figure 2B:
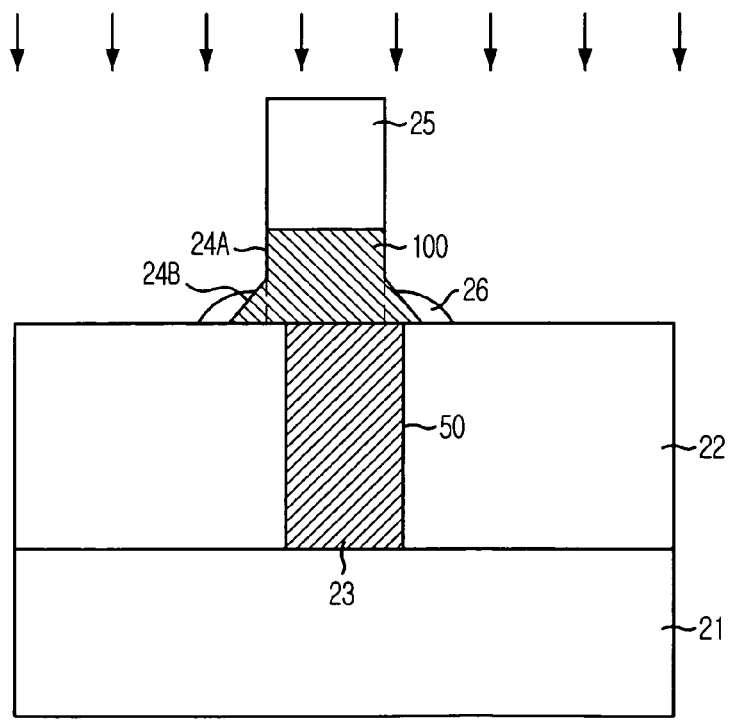
Figure 2C:
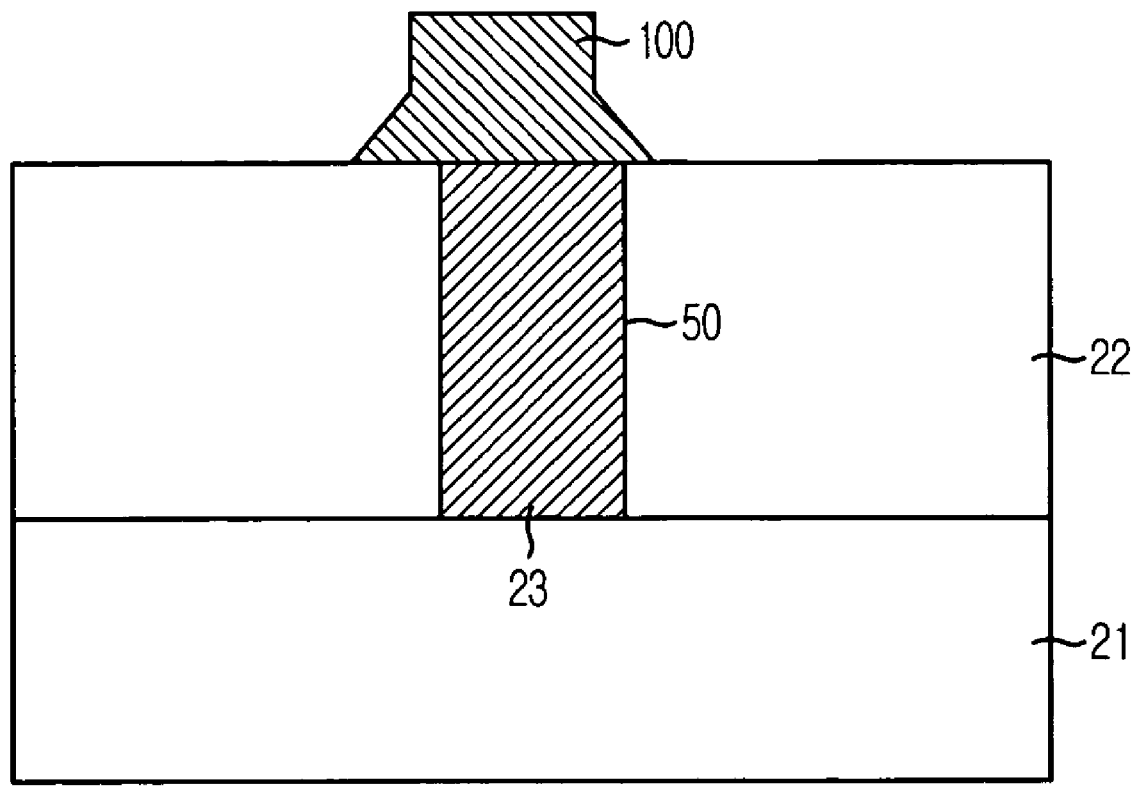

FIGS. 2A to 2C are cross-sectional views illustrating a method for fabricating a metal line in a semiconductor device in accordance with a specific embodiment of the present invention.

As shown in FIG. 2A, an inter-layer insulation layer 22 is formed on a substrate 21, wherein the substrate 21 is completed with prescribed processes. Then, the inter-layer insulation layer 22 is selectively etched to form a contact hole 50. Next, a contact plug 23 buried in the contact hole 50 is formed. Herein, the contact plug 23 includes tungsten buried in the contact hole 50.

Subsequently, a metal layer 24 for use as a metal line is formed on the inter-layer insulation layer and the contact plug 23. Then, the metal layer 24 is covered with photoresist, and patterned by a photo-exposure and developing process to form a mask 25 for use in a metal line process. Herein, the metal layer 24 is formed with aluminum, and especially, a low temperature process is used to prevent a generation of micro-bridges.

Furthermore, a first etching process is performed by partially etching the metal layer 24 by using the mask 25 as an etch barrier. Herein, the first etching process on the metal layer 24 utilizes a chlorine ($Cl_2$)-based gas, and etches up to approximately 50% of the total thickness of the metal layer 24.

Because the first etching process uses the chlorine-based gas, a cross-sectional view of the etched metal layer 24 shows a vertical profile 24A. Also, almost no polymer is generated during the first etching process using the chlorine-based gas.

As shown in FIG. 2B, a second etching process is performed to form a metal line 100. Herein, the second etching process includes etching a remaining portion of the metal layer 24 until the surface of the inter-layer insulation layer 22 is exposed, using the mask 25 as an etch barrier.

At this time, the second etching process on the metal layer 24 uses a considerable amount of helium (He) gas as a main etching gas with a quantity of flow ranging from approximately 100 sccm to approximately 300 sccm. Also, hydrogen bromide (HBr) gas is added to the He gas in the process with a quantity of flow ranging from approximately 50 sccm to approximately 150 sccm. Herein, the amount of flow of the HBr gas is a half the amount of flow of the He gas. Furthermore, to preserve an etch rate of the aluminum layer used as the metal layer 24, a small amount of a chlorine ($Cl_2$)-based gas is added during the second etching process with a quantity of flow ranging from approximately 10 sccm to approximately 50 sccm.

Moreover, during the second etching process, a plasma power, i.e., a source power and a bias power, for inducing activation and straight directionality of etch ions inside an etch chamber can be performed in an apparatus which supplies power to both top and bottom regions of a wafer, or in an apparatus which supplies power to a top region. When the source power and the bias power are separately supplied, the bias power is increased to prevent the etch ions from concentrating toward the contact plug 23. Herein, a ratio of the source power to the bias power ranges from approximately 2:1.5 to approximately 2:2.

If a mixed gas of He, HBr and $Cl_2$ is used in the second etching process of the metal layer 24, a considerable amount of polymer 26 is generated due to the He and HBr gases. Thus, a bottom portion of the metal line 100 is formed with a slope profile 24B.

That is, by performing the second etching process with the mixed gas of He, HBr and $Cl_2$, the slop profile 24B can be formed, and a considerable amount of the polymer 26 can be formed on the bottom etched portion.

According to the description above, separate etching processes including the first and the second etching processes are performed to form the metal line 100. In the first etching process, the vertical profile 24A is formed by etching by using the etching gas which does not generate polymer, and in the second etching process, the slope profile 24B is formed at the bottom etched portion of the metal line 100, and accordingly, a considerable amount of the polymer 26 is formed on the bottom etched portion. Thus, an overlay margin between the metal line 100 and the contact plug 23 at the bottom is increased by the formations of the slope profile 24B and a considerable amount of the polymer 26.

Furthermore, a line width of the metal line 100 is increased due to the bottom etched portion of the metal line 100 formed in the slope profile 24B, and a considerable amount of the polymer 26 works as an etch barrier between the contact plug 23 and the metal line 100 by overlapping the entrance of the contact plug 23. Thus, the contact plug 23 is prevented from being damaged during the second etching process. That is, the polymer 26 generated during the second etching process is accumulated on regions adjacent to the metal line 100 and the contact plug 23, preventing concentrated damage by the etch ions.

As shown in FIG. 2C, the mask 25 is stripped. At this time, the polymer 26, formed at the bottom etched portion of the metal line 100, is removed simultaneously.

In accordance with the specific embodiment of the present invention, the overlay margin between the metal line and the contact plug at the bottom can be increased by forming the bottom etched portion of the metal line in a slope profile. Also, a considerable amount of polymer is formed during the formation of the slope profile. The polymer is formed as an etch barrier between the contact plug and the metal line, and thus, damage caused by etching can be prevented.

The present application contains subject matter related to the Korean patent application No. KR 2005-49805, filed in the Korean Patent Office on Jun. 10, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a metal line in a semiconductor device, comprising:
   forming an inter-layer insulation layer on a substrate;
   forming a contact hole by etching the inter-layer insulation layer;
   forming a metal layer on the inter-layer insulation layer and the contact hole;
   etching a portion of the metal layer through performing a first etching process; and
   etching a remaining portion of the metal layer through performing a second etching process until the surface of the inter-layer insulation layer is exposed and a bottom portion of the metal line is sloped.

2. The method of claim 1, wherein the first etching process is performed with an etching gas that does not generate polymer, and the second etching process is performed with an etching gas that generates a considerable amount of polymer.

3. The method of claim 1, wherein the first etching process includes etching the metal layer up to approximately 50% of the total thickness of the metal layer.

4. A method for fabricating a metal line in a semiconductor device, comprising:
   forming an inter-layer insulation layer on a substrate;
   forming a contact hole by etching the inter-layer insulation layer;
   forming a tungsten plug buried in the contact hole;
   forming an aluminum layer on the inter-layer insulation layer and the tungsten plug by employing a low temperature process;
   etching a portion of the aluminum layer through performing a first etching process; and
   etching a remaining portion of the aluminum layer through performing a second etching process until the surface of the inter-layer insulation layer is exposed and a bottom portion of the aluminum layer is sloped.

5. The method of claim 4, wherein the first etching process is performed using a chlorine-based gas.

6. The method of claim 4, wherein the second etching process utilizes helium (He) gas as a main etching gas, and is performed using a mixed gas of the He gas, hydrogen bromide (HBr) gas and a chlorine-based gas.

7. The method of claim 6, wherein the He gas flows in an amount ranging from approximately 100 sccm to approxi mately 300 sccm; the HBr gas flows in an amount ranging from approximately 50 sccm to approximately 150 sccm; and the chlorine-base gas flows in an amount ranging from approximately 10 sccm to approximately 50 sccm.

8. The method of claim 4, wherein the second etching process is performed in an apparatus capable of supplying power to both top and bottom regions of a wafer.

9. The method of claim 4, wherein the second etching process is performed in an apparatus capable of supplying power to a top region of a wafer.

10. The method of claim 4, wherein the second etching process is performed in an apparatus with a ratio of a source power to a bias power ranging from approximately 2:1.5 to approximately 2:2.

11. The method of claim 4, wherein the first etching process includes etching the aluminum layer up to approximately 50% of the total thickness of the aluminum layer.

* * * * *